United States Patent [19]

Amemiya et al.

[11] Patent Number: 4,720,734

[45] Date of Patent: Jan. 19, 1988

[54] LOW LOSS AND HIGH SPEED DIODES

[75] Inventors: Yoshihito Amemiya; Yoshihiko Mizushima, both of Fuchu, Japan

[73] Assignee: Nippon Telegraph and Telephone Public Corporation, Japan

[21] Appl. No.: 936,949

[22] Filed: Dec. 1, 1986

Related U.S. Application Data

[63] Continuation of Ser. No. 416,508, Sep. 10, 1982, abandoned.

[30] Foreign Application Priority Data

| Sep. 11, 1981 | [JP] | Japan | 56-143640 |
| Jan. 14, 1982 | [JP] | Japan | 57-4301 |
| Feb. 27, 1982 | [JP] | Japan | 57-31322 |
| Feb. 27, 1982 | [JP] | Japan | 57-313323 |

[51] Int. Cl.$^4$ .......................... H01L 29/48
[52] U.S. Cl. ...................... 357/15; 357/13; 357/58
[58] Field of Search ............. 357/15, 13, 56, 58

[56] References Cited

U.S. PATENT DOCUMENTS

| 3,668,481 | 6/1972 | Saltich et al. | 357/15 |
| 4,045,248 | 8/1977 | Shannon et al. | 357/15 |
| 4,047,218 | 9/1977 | Clark et al. | 357/15 |
| 4,089,020 | 5/1978 | Ikeda et al. | 357/15 |
| 4,110,488 | 8/1978 | Risko | 357/15 |
| 4,110,775 | 8/1978 | Festa | 357/15 |

FOREIGN PATENT DOCUMENTS

| 0008779 | 1/1977 | Japan | 357/15 M |
| 52-31675 | 3/1977 | Japan | 357/15 |
| 0028259 | 3/1977 | Japan | 357/15 A |
| 0128879 | 10/1980 | Japan | 357/15 M |
| 0148457 | 11/1980 | Japan | 357/86 |
| 56-35473 | 4/1981 | Japan | 357/15 |

OTHER PUBLICATIONS

Solid State Electronics, vol. 18, p. 715 (1975) by J. R. Hauser.
Applied Physics Letters, vol. 25 #1, pp. 75-77, 1974, by Shannon.
Applied Physics Letters, vol. 24 #8, pp. 369-371, 1974, by Shannon.
IEEE Proceedings, vol. 63, p. 1523, 1975, by Harice.
Electronics Letters, vol. 12 #10 May 13, 1976, p. 238, "High Power P+ Schottky Baritt Diodes" by Ahmad.
Solid State Electronics, vol. 16 pp. 357-364, 1973 "Modulation Effect by Intense Hole Injection" by Jager et al.
Solid State Electronics, vol. 12 pp. 107-109'- 'Metal-Semiconductor Impatt Diode" 1969 by Sze.
Physics of Semiconductor Devices 2nd ed 1981 S. M. Sze p. 294.
Solid State Electronics, 1973, vol. 16, pp. 357-364 "Modulation Effect by Intense Hole Injection in Schottky Barrier Diodes" by Jager and Kosah.
IEEE Transactions on Electron Devices, vol. ED-16, No. 1, Jan. 69 "PN Junction-Schottky Barrier Hybrid Diode" by Zettler and Cowley.
"Theoretical Performance of the Schottky Barrier Power Rectifier" by D. J. Page, SSE vol. 15, No. 5-C, p. 509.
"Comparison of the pn Fast Switching Rectifier and the Schottky Rectifier" by Robert A. Smith et al, IAS 76 Annual, p. 61.

*Primary Examiner*—Andrew J. James
*Assistant Examiner*—Mark Prenty
*Attorney, Agent, or Firm*—Charles W. Helzer

[57] ABSTRACT

A diode having a Schottky barrier which permits bidirectional passage of minority carriers as well as majority carriers through the provision of a bidirectional conducting Schottky electrode that substitutes for the conventional Schottky electrode used in Schottky diodes or for the low-high electrode in Pn junction diodes.

3 Claims, 20 Drawing Figures

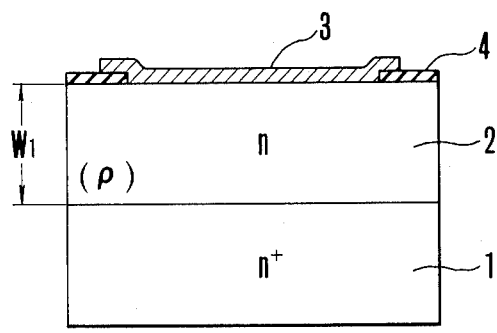
F I G.1
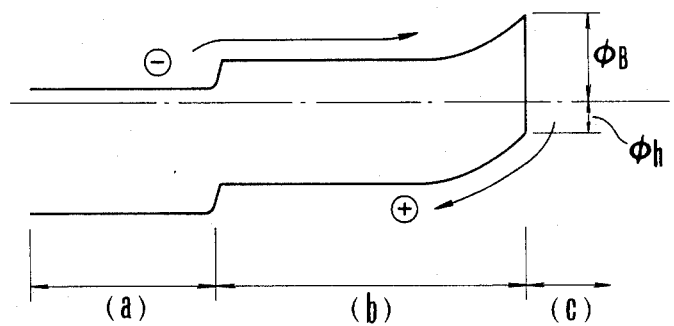
F I G.2

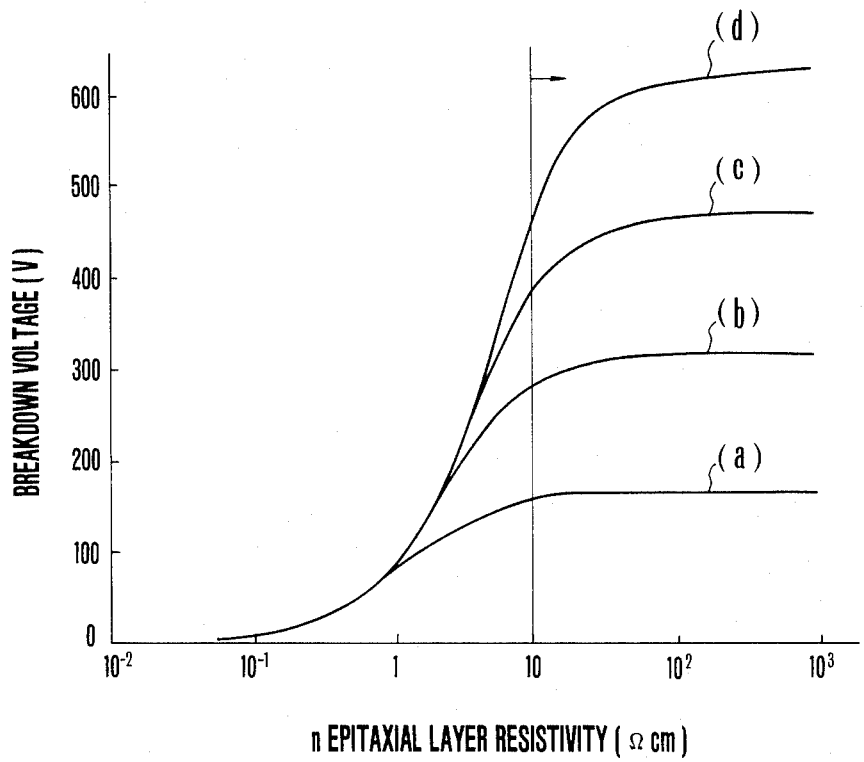
F I G. 3

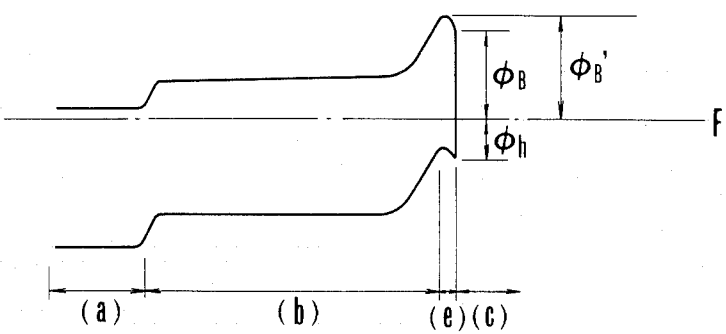
F I G.12
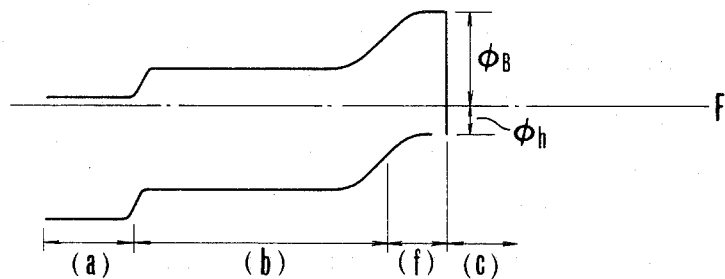
F I G.13
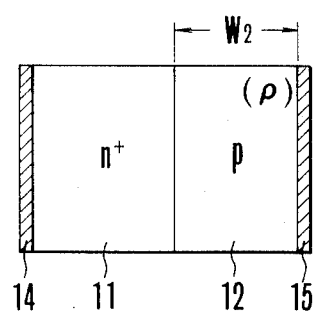
F I G.14
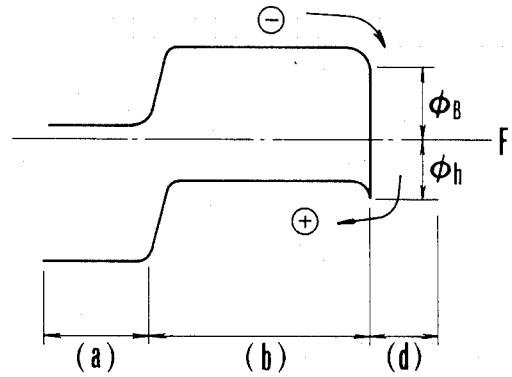
F I G.15

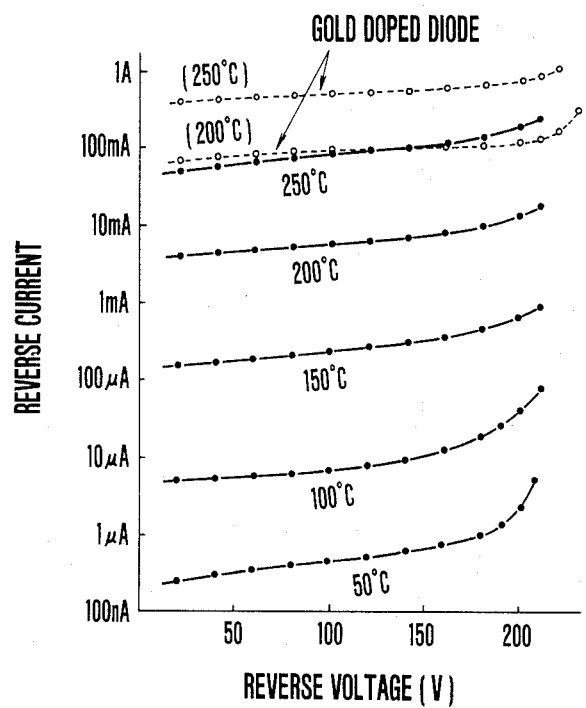
F I G. 19
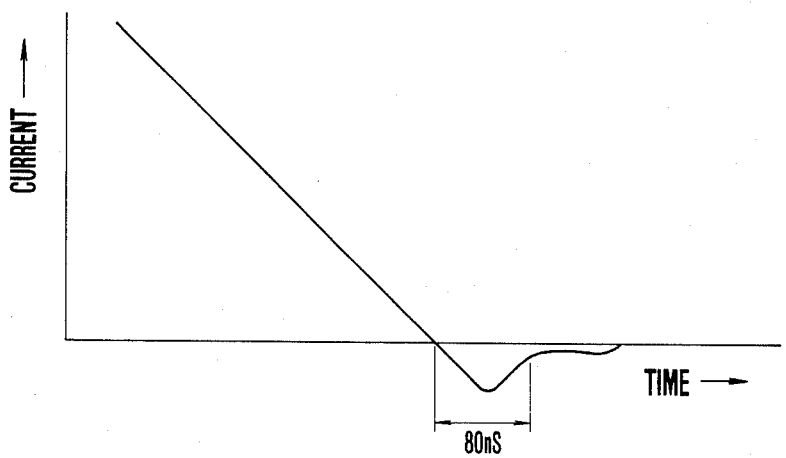
F I G. 20

LOW LOSS AND HIGH SPEED DIODES

This application is a continuation of application Ser. No. 416,508, filed Sept. 10, 1982, now abandoned.

BACKGROUND OF THE INVENTION

This invention relates to rectifying diodes suited for high speed power switching purposes.

Recently, the high speed switching technology has become popular in various fields dealing with power electronics. Typical examples of application are switching power sources, motor control and electronic control of various industrial machines.

The introduction of high speed switching into the field dealing with power meets the ends of power saving and size and weight reduction of apparatus which have long been desired. To these ends, however, great improvements in the characteristics of rectifying diodes are required.

The electric properties required for rectifying diodes for switching power sources are:
(1) low forward voltage (i.e., low loss),
(2) short reverse recovery time (i.e., high speed),
(3) high upper limit of permissible temperature (i.e., high operating temperature),
(4) high breakdown voltage, and
(5) low switching noise.

It is not so easy to simultaneously meet all these requirements. Diodes are based on the most basic principles and structure among semiconductor elements, and unlike ICs it is difficult to vary their characteristics over wide ranges with corresponding variety of circuit constructions and patterns. Therefore, the gist of the improvement of power diodes is how to modify the basic operational principles and structure for obtaining the electric properties listed above to the utmost.

At present the diodes which are practically used for high speed power rectification are of two types, i.e., Schottky diode and pn junction diode. Each type has disadvantages as described below and its range of application is limited.

From the standpoint of high speed operation, the Schottky diode is presently most excellent since it is a majority carrier element having fast reverse recovering speeds. In addition, the Schottky diode has further advantages of lower forward voltage than that of the pn junction diode and capability of high efficiency operation. However, Schottky diodes conventionally used have a breakdown voltage which is about 50 V at the most, so that its use has essentially been limited only to low voltage applications. Also, the Schottky diode has a large junction capacitance and its upper limit of permissible temperature is low.

The disadvantages of the Schottky diode will now be explained in greater detail. The Schottky diode of a general structure comprises a low resistivity n-type substrate, an n-type epitaxial layer deposited on the substrate and a metal electrode or Schottky electrode forming a Schottky junction with the n-type epitaxial layer. The resistivity of the silicon n-type substrate is usually set to be 0.1 Ωcm or less preferably 0.02 Ωcm or less.

To provide for a high breakdown voltage with the above construction, both the resistivity and thickness of the n-type epitaxial layer have high values. Doing so, however, increases the resistance of the n-type epitaxial layer to greatly increase the parasitic voltage drop that develops across the n-type epitaxial layer when a forward current is passed. Therefore, there are restrictions on these parameters, and it has been common in the conventional power Schottky to set the resistivity and thickness of the silicon n-type epitaxial layer to 1 Ωcm or less and 3 μm or less, respectively. For these reasons, the practical breakdown voltage has been within approximately 50 V as has been mentioned. In this respect, one may refer to "Theoretical Performance of the Schottky Barrier Power Rectifier" by D. J. Page, SSE Vol. 15, No. 5-C, page 509, and "Comparison of the pn Fast Switching Rectifier and the Schottky Rectifier" by Robert A Smith et al, IAS 76 Annual, page 61.

The inevitable reduction in thickness and resistivity of the n-type epitaxial layer in the conventional Schottky diode is due to the fact that because the Schottky diode is a majority carrier element and the conductivity modulation of the n-type epitaxial layer by means of minority carriers (hole) cannot be expected, the resistivity of the n-type epitaxial layer acting by itself as a diode series resistor must be reduced to decrease the forward voltage. As a result, breakdown voltage is decreased and junction capacitance is increased. A further technical consideration has been predominant in the past, according to which the presence of even a very slight quantity of minority carriers in the Schotky diode reduces the operating speed and has adverse effects (Refer to "Physics of Semiconductor Devices" by S. M. Sze, John Wiley & Sons, New York, 1969). For this reason, the injection of minority carriers has been avoided as much as possible by making the Schottky electrode have a potential barrier value of 0.4 eV or more against holes, and as far as the conventionally familiar technology is concerned, utilization of hole injection from the Schottky barrier to the n-type epitaxial layer has not been practiced.

In many fields dealing with power, pn junction diodes are often used because high voltages are involved. The pn junction diode has a small reverse recovery speed (about 0.5 μS or more in terms of recovery time) due to the storage of minority carriers and is unsuitable for high speed operation.

A typical structure of the conventional pn junction diode comprises a low resistivity n-type substrate, a high resistivity p-type epitaxial layer deposted on the substrate and a p+ contact layer of high impurity concentration formed in the epitaxial layer. Further, metal electrodes are formed on surface of the n-type substrate and p+ contact layer, respectively. The p+ contact layer and the metal electrode thereon forms a so-called low-high electrode. The resistivity of the n-type substrate and p+ contact layer is usually set to 0.1 Ωcm or less, preferably 0.02 Ωcm or less. The resistivity of the p-type epitaxial layer is set to 1 Ωcm or more in order to ensure sufficient breakdown voltage. In this case, the impurity concentration in the p+ contact layer is set to $5 \times 10^{18}$ cm$^{-3}$ or more.

In the above prior art pn junction diode, minority carriers (electrons) injected from the n-type substrate during forward current conduction cannot jump over the low-high electrode and a great quantity of electrons is stored in the high resistivity p-type epitaxial layer, so that the reverse recovery speed is reduced. Further, a voltage drop across the low-high electrode is added.

The phenomenon described above is discussed in detail in "Minority Carrier Reflecting Properties of Semiconducto High-Low Junctions" by J. R. Hauser et al, Solid State Electronics, Vol. 18, p. 715 (1975).

For attainment of high speed operation, a gold doped diode has been manufactured wherein an epitaxial layer of a pn junction diode is doped with gold. In the gold doped diode, however, the upper limit of the permissible temperature is reduced, that is, one of the features of the pn junction diode is lost. Also, the forward voltage is increased and the uniformity of manufacture is reduced. Switching noise is also increased.

SUMMARY OF THE INVENTION

The present invention contemplates elimination of the aforementioned disadvantages of the conventional Schottky and pn junction diodes and has for its object to provide a diode of low loss, high speed, high breakdown voltage, high temperature resistance and low noise.

According to the invention, the above object is accomplished by a diode having a Schottky barrier which permits bidirectional passage of minority carriers as well as majority carriers and employs an electrode bidirectional conducting characteristics that substitutes for the conventional Schottky electrode in Schottky diodes and for the low-high electrode in pn junction diodes.

Specifically, to obtain desired characteristics, structural parameters of the diode according to the invention are set to fall within a range which is considerably different from that of the conventional diodes.

In an embodiment, the diode of the invention takes the form of a pn junction diode having a Schottky barrier electrode, providing a novel structure of pn junction diode.

In designing a Schottky diode and a pn diode based on teachings of the present invention that the diode has a Schottky barrier contact which permits bidirectional passage of minority carriers as well as majority carriers as an electrode, it is necessary to determine lower limits on resistivity $\rho$ and thickness W of the epitaxial layer for attainment of high breakdown voltage, an upper limit of Schottky barrier value $\phi h$ with respect to holes for attainment of low forward voltage drop by obtaining a quantity of injected holes effective for operation, and lower limit on $\phi h$ and upper limit on the thickness W of the epitaxial layer for attainment of high speed operations by reducing storage of injected holes. The upper and lower limits are specified as:

for a silicon Schottky diode, $\rho > 10 \ \Omega cm$ $0.1 \ eV < \phi h < 0.4 \ eV$ $5 \ \mu m < W < 20 \ \mu m;$ for a pn junction diode, $\rho > 1 \ \Omega cm$ $0.15 \ eV < \phi h < 0.35 \ eV$ $5 \ \mu m < W < 30 \ \mu m.$ When considering irregularities of $\phi h$ of $\pm 0.01$ to $0.02$ in manufacture due to critical conditions for thermal treatment, the range of $\phi h$ is preferably, $0.15 \ eV < \phi h < 0.35 \ eV$ for the Schottky diode.

Thus, with the Schottky diode of the invention, the speed is approximately the same as or higher than the speed of the conventional diode, but nevertheless the breakdown voltage is higher, the junction capacitance is lower, and the upper limit of the permissible temperature is higher. With the pn junction diode of the invention, stability and robustness are substantially the same as with the conventional pn junction diode without gold doping, and nevertheless the permissible temperature is higher, the breakdown voltage is higher, the speed is higher and the forward voltage drop is lower. In comparison to the gold-doped high speed diode, the permissible temperature is higher, the switching noise is less, and the forward voltage drop is lower.

BRIEF DESCRIPTION OF THE DRAWINGS

FIG. 1 is a sectional view showing a Schematic construction of a Schottky diode according to one embodiment of the invention;

FIG. 2 is an energy level diagram in the diode of FIG. 1;

FIG. 3 is a graph showing the relation between breakdown voltage and resistivity of n-type epitaxial layer in silicon Schottky diodes;

FIG. 12 is an energy level diagram in the Schottky diode of FIG. 11;

FIG. 13 is an energy level diagram in still another example of the Schottky diode according to the invention;

FIG. 14 is a sectional view showing a schematic construction of a pn junction diode according to another embodiment of the invention;

FIG. 15 is an energy level diagram in the diode of FIG. 14;

FIG. 19 is a graph showing the relation between reverse current and reverse voltage in the pn junction diode of FIG. 18; and FIG. 20 is a graph showing a reverse recovery characteristic of the pn junction diode of FIG. 18.

DESCRIPTION OF PREFERRED EMBODIMENT

Figure 4:
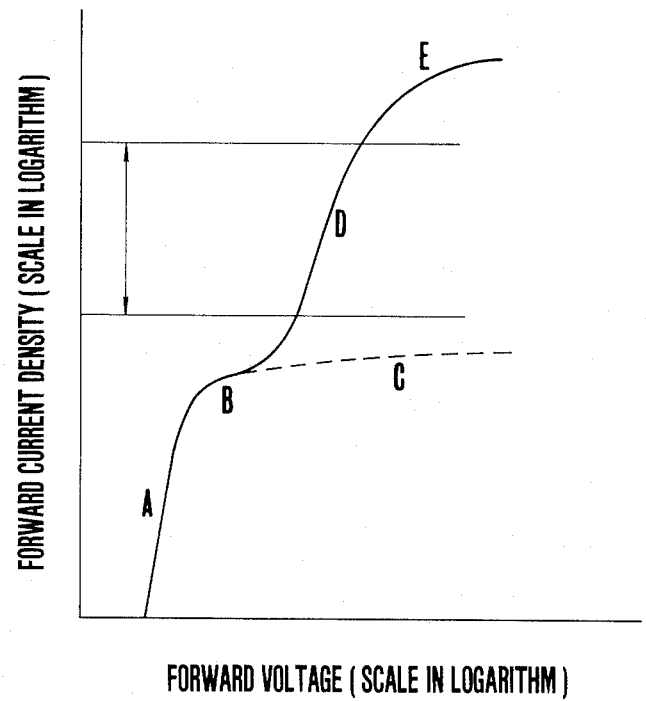
FIG. 4 is a graph showing a forward current density versus forward voltage characteristic of a Schottky diode according to the invention.

The invention will first be described by way of example in the form of a Schottky diode.

The inventions of the present invention have conducted extensive analysis and experiments and found that under certain conditions conductivity modulation of the n-type epitaxial layer can be produced during forward current conduction in Schottky diodes without sacrifice of the reverse recovery characteristic at all. The invention is predicated on this finding to provide the following ranges of structural parameters of the Schottky diode. Specifically, with reference to FIG. 1 showing a schematic construction of a Schottky diode according to the invention in a predetermined range of the thickness of an n-type epitaxial layer 2 deposted on an n-type substrate 1, the potential barrier value $\phi B$ of the Schottky junction with respect to electrons (majority carriers represented by $\ominus$ in the figure) and the potential barrier value $\phi h$ of the junction with respect to holes (minority carriers represented by $\oplus$ in the figure) as shown in FIG. 2 are set to fall within ranges within which a sufficient quantity of holes to effect conductivity modulation of the n-type epitaxial layer 2 can flow from a metal electrode 3 into the n-type epitaxial layer 2 in a forwardly biased state of the Schottky diode. With this arrangement, resistivity $\rho$ and thickness $W_1$ of the n-type epitaxial layer 2 can be greatly increased compared to the prior art. Thus, it is possible to greatly improve the breakdown voltage characteristic. FIG. 2 shows an energy level diagram of the Schottky diode shown in FIG. 1. In the Figure, regions (a), (b) and (c) correspond to the n-type substrate 1, n-type epitaxial layer 2 and metal electrodes 3 (Schottky electrode), respectively. Shown at F is the Fermi level.

Specific ranges of $\phi B$ and $\phi h$, which are essential to the Schottky diode structure according to the invention, will now be discussed in connection with silicon Schottky diode.

First, the resistivity $\rho$ and thickness $W_1$ of the n-type epitaxial layer 2 that are required for materializing an actual high breakdown voltage Schottky diode will be discussed. If the metal electrode 3 in the structure of FIG. 1 is made negative with respect to the n-type substrate 1, a depletion layer is developed to extend from the boundary between the n-type epitaxial layer 2 and metal electrode 3, i.e., the Schottky junction, into the n-type epitaxial layer 2. As the resistivity $\rho$ of the n-type epitaxial layer 2 is increased, the breakdown voltage is also increased. Moreover, the depletion layer cannot extend beyond the thickness of the n-type epitaxial layer 2, so that the breakdown voltage cannot be increased beyond a certain value with increasing resistivity $\rho$. The maximum breakdown voltage is equal to the product of the avalanche electric field value of the semiconductor and the thickness of the n-type epitaxial layer 2. FIG. 3 shows the relation between the breakdown voltage and the resistivity $\rho$ of the n-type epitaxial layer 2 in the case of silicon Schottky diodes for different values of the thickness of the n-type epitaxial layer 2 ranging from 5 $\mu$m to 20 $\mu$m. Curves (a), (b), (c) and (d) correspond to cases where the thickness of the n-type epitaxial layer 2 is respectively 5 $\mu$m, 10 $\mu$m, 15 $\mu$m and 20 $\mu$m. The thickness value of 5 $\mu$m is a minimum value necessary for obtaining a breakdown voltage which is definitely higher than (at least double) the breakdown voltage (50 V) of the prior art Schottky diode. Thickness value of 20 $\mu$m is a maximum value in view of avoiding the deterioration of the operation speed characteristics of the Schottky diode under the injection of holes characteristic to the Schottky diode of this invention as will be described later.

It will be seen from FIG. 3 that with a given thickness of the n-type epitaxial layer 2 of the silicon Schottky diode, the resistivity $\rho$ of the n-type epitaxial layer 2 is desirably at least 10 $\Omega$cm, preferably above, for effectively realizing the high breakdown voltage characteristic. It will be appreciated that the n-type epitaxial layer 2 may be of a multi-layer.

When the n-type epitaxial layer 2 of high resistivity as shown is used, a current versus voltage characteristic different from that in the prior art can be obtained as shown in FIG. 4. As shown, a tendency similar to the characteristic of the usual Schottky diode can be obtained within a comparatively low applied voltage range as indicated at A. In the Figure, scales are in logarithm for both the ordinate and abscissa. As the current is increased with increase of the applied voltage, however, the characteristic is curved as shown at B due to the series resistance of the n-type epitaxial layer 2 in the case of the prior art Schottky diode. If this tendency would continue, the forward voltage would sharply increase as shown dashed curve C before the normal working current range shown by arrows is reached.

To cope with this, according to the present invention, the potential barrier value $\phi h$ of the Schottky junction with respect to holes is set to be below a certain value. By so doing, conductivity modulation by holes injected from the metal electrode 3 into the n-type epitaxial layer 2 can be obtained to reduce the series resistance effect of the high resistivity n-type epitaxial layer 2. In this case, the forward voltage can be reduced for the normal current range as shown at D in FIG. 4. When the current is further increased, the conductivity modulation becomes insufficient because there is an upper limit of the quantity of holes injected by jumping over the potential barrier of $\phi h$. Therefore, the forward voltage is sharply increased as shown at E. It will be seen that the upper limit of $\phi H$ must be set such that this sharply increasing region is outside the normal current range.

The potential barrier value $\phi h$ of the Schottky junction with respect to holes also has a lower limit. If the value of $\phi h$ is over-decreased, excessive hole injection and large hole accumulation happen, which decreases the operation speed of the element.

Figure 5:
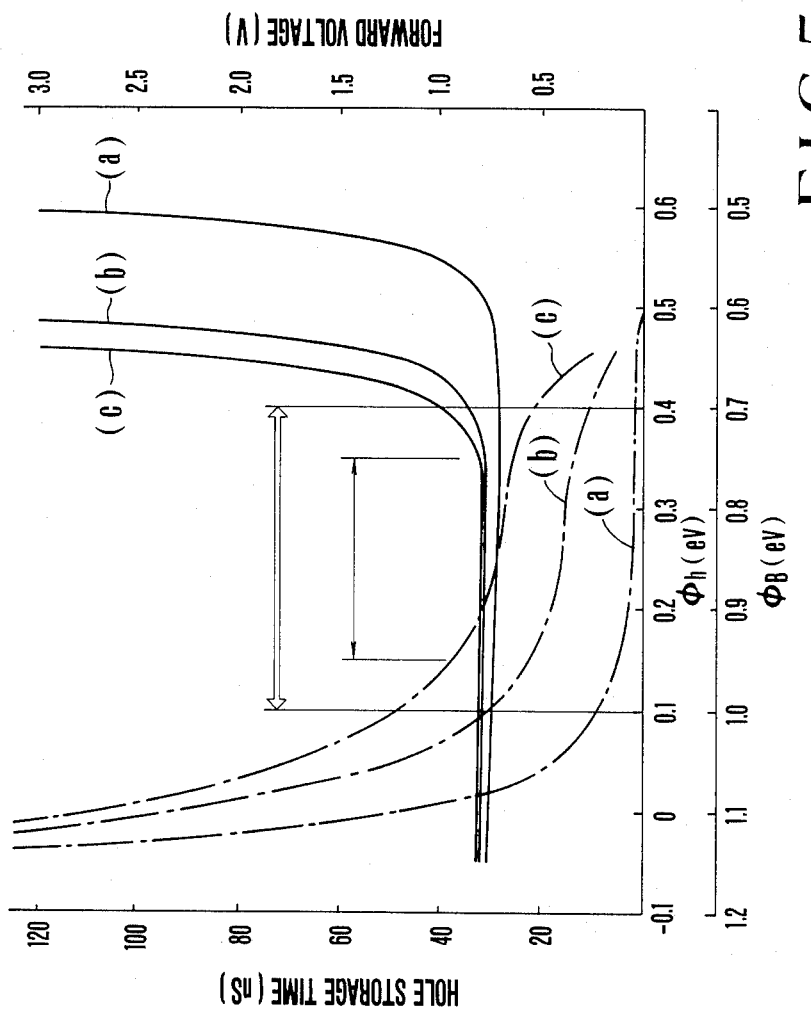
FIG. 5 is a graph showing the dependency of forward voltage and hole storage time on Schottky potential barrier values in silicon Schottky diodes.

The upper and lower limits of $\phi h$ are determined in the case of silicon Schottky diodes as follows. FIG. 5 shows the dependency of forward voltage and hole storage time on $\phi h$ and $\phi B$ in the ranges of $\phi h = -0.1$ to 0.6 eV (corresponding to $\phi B = 1.2$ to 0.5 eV) for various values of the thickness of the n-type epitaxial layer 2 ranging from 5 to 20 $\mu$m. In the case of silicon Schottky diodes the sum of $\phi B$ and $\phi h$ is always equal to the fobidden band width of 1.1 eV unless a special structure as will be described later is adopted. For this reason, in the abscissa the values $\phi B$ and $\phi h$ are graduated in opposite directions. In the graph, solid curves represent the forward voltage, and chained line curves represent the hole storage time. The curves (a), (b) and (c) correspond to cases where the thickness of the n-type epitaxial layer 2 is respectively 5 $\mu$m, 15 $\mu$m and 20 $\mu$m.

Since the normal operating current density of a power diode is usually 50 to 300 A/cm$^2$, the forward voltage is plotted at 300 A/cm$^2$, while the hole storage time is plotted at a maximum value within the current density range. Where the resistivity $\rho 0$ of the n-type epitaxial layer 2 is 10 $\Omega$cm or more, the illustrated characteristics are substantially independent of the resistivity.

The sharp increase of the forward voltage in the right hand part of the graph of FIG. 5 is due to insufficient conductivity modulation that results from the reduction in quantity of holes injected into the n-type epitaxial layer 2 with increasing $\phi$h. The sharp increase of the hole storage time in the left hand part of the graph is attributable to a sharp upward curving of the conduction band of the n-type epitaxial layer 2 in the neighborhood of the Schottky junction with decreasing $\phi$h. It will be seen from the graph that for the structure according to the invention, it is necessary to set $\phi$h to be 0.1 eV$<\phi$h$<$0.4 eV, as shown by thick arrows in the graph. However, when considering irregularities of $\phi$h of $\pm$0.01 to 0.02 in manufacture due to critical conditions for thermal treatment, the range of $\phi$h is preferably, 0.15 eV$<\phi$h$<$0.35 eV as shown by thin arrows. It will also be seen that the thickness of the n-type epitaxial layer 2 must be 20 $\mu$m or less in order to ensure a high speed comparable to that of the prior art Schottky diode (approximately 40 nsec.). Examples of the material of the metal electrode that can satisfy the aforementioned conditions of $\phi$h are Pt ($\phi$h=0.2 eV), Pt Si ($\phi$h=0.25 eV), Pd ($\phi$h=0.35 eV), IR ($\phi$h=0.15 eV) and Nipt ($\phi$h=0.4 eV), of which Pt Si showing a mediam of $\phi$h is the most preferable.

The invention will now be described by way of a specific structure of the Schottky diode.

Figure 6:
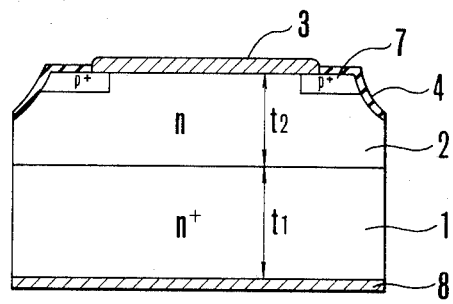
FIG. 6 is a sectional view showing an example of the Schottky diode according to the invention.

In FIG. 6, on an n-type silicon substrate 1 having a thickness of t1=280 $\mu$m and a resistivity of 0.01 $\Omega$cm, an n-type epitaxial silicon layer 2 with a resistivity of 25 $\Omega$cm is deposited to a thickness of t2=15 $\mu$m. (corresponding to $W_1$ in FIG. 1) A guard ring 7 is then formed from the surface of the layer 2 to a depth of 1 $\mu$m with a surface impurity concentration of $5\times10^{18}$ cm$^{-3}$. Then, an edge portion of the guard ring is etched to a depth of 5 $\mu$m to form a mesa. Then an oxide film 4 with a thickness of approximately 0.6 $\mu$m is formed by oxidation for protection of the guard ring edge. Then a Schottky electrode 3 is formed by depositing platinum to a thickness of 0.5 $\mu$m. A metal electrode 8 is formed on the back side by doping an n-type impurity at a surface impurity concentration of $1\times10^{20}$ cm$^{-3}$ or more and then depositing nickel to a thickness of 0.2 $\mu$m and then silver to a thickness of 0.5 $\mu$m. After the electrode formation, heat treatment is carried out at 450° C. for 20 minutes. The diode thus obtained has an effective area of 20 mm$^2$.

Figure 7:
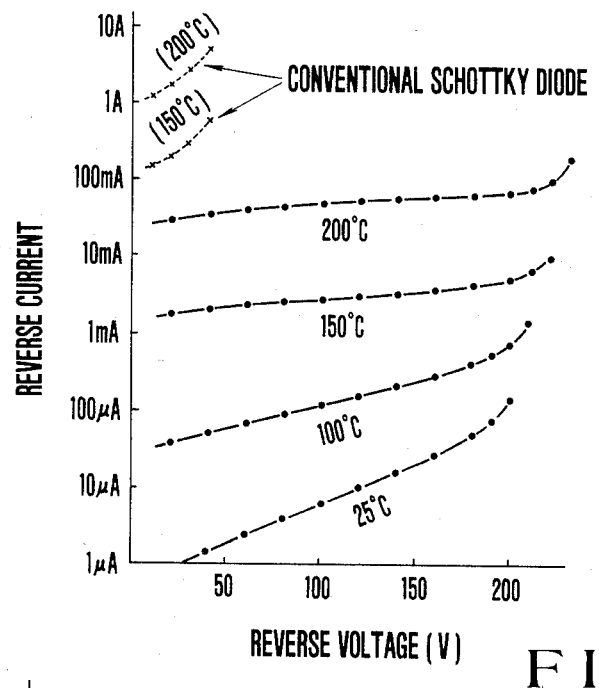
FIG. 7 is a graph showing the relation between reverse current and reverse voltage in the Schottky diode of FIG. 6.

FIG. 7 shows reverse current versus reverse voltage characteristics of the diode thus obtained in comparison with those of the conventional Schottky diode. In the Figure, temperatures are permissible temperatures.

It will be seen that a breakdown voltage of 200 V or more can be obtained, and permissible temperature of the junction may be about 200° C. In the instant example, the breakdown voltage is restricted by the yield voltage of the mesa portion of the p-type guard ring, and further improvement of the breakdown voltage is possible.

Figure 8:
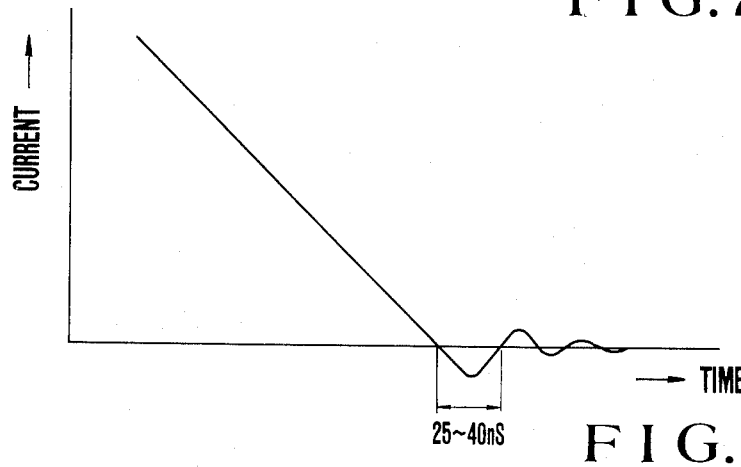
FIG. 8 is a graph showing a reverse recovery characteristic of the Schottky diode of FIG. 6.

FIG. 8 shows a reverse recovery characteristic of the Schottky diode. This curve represents current plotted against time, and is obtained by first causing a forward current of 30 A and then reducing it at a rate of 50 A/$\mu$sec.

It will be seen that the reverse recovery time after the reversal of the direction of current is 25 to 40 nsec. This diode thus has a high speed comparable to that of the prior art Schottky diode (i.e., 30 to 50 nsec.). The forward voltage drop of this diode is 0.75 V when the current passed is 30 A.

For comparison of characteristics of the conventional Schottky diode with the diode of this embodiment, reference is made to Table 1 below.

TABLE 1

|  | Breakdown voltage (V) | Junction capacitance (pf) | Recovery time (ns) | Permissible temp. (°C.) | Forward voltage (V) |
|---|---|---|---|---|---|
| Conventional Schottky diode | 30 to 50 | 2000 to 3000 | 30 to 50 | 125 | 0.50 |
| The present Schottky diode | 150 to 200 | 500 to 800 | 25 to 40 | — 200 | 0.75 |

Incidentally, with metal materials which do not by themselves meet the aforementioned ranges of $\phi$H and $\phi$B, it is possible to establish equivalent states by which the ranges required for $\phi$h and $\phi$B are satisfied.

Figure 9:
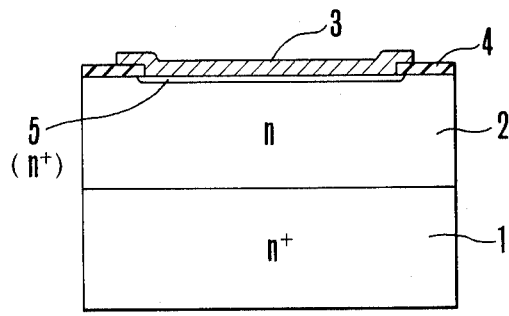
FIG. 9 is a sectional view showing a schematic construction of another example of the Schottky diode according to the invention.

More particularly, FIG. 9 shows a modified structure of a silicon Schottky diode according to the invention where a metal electrode 3 is formed using a metal which fails to meet the condition 100 B$<$1.0 eV although it meets the condition $\phi$h$<$0.4 eV. This structure is different from the structure shown in FIG. 1 in that a thin n-type intervening layer 5 of a high impurity concentration is provided at the boundary between the n-type epitaxial layer 2 and metal electrode (i.e., Schottky electrode) 3. The thickness of the n-type intervening layer 5 must be smaller than the thickness or depth of the depletion layer that is developed from the Schottky electrode 3 in the zero bias state, for instance 100 Å or less when the impurity concentration is $10^{18}$ to $10^{20}$ cm$^{-3}$.

Figure 10:
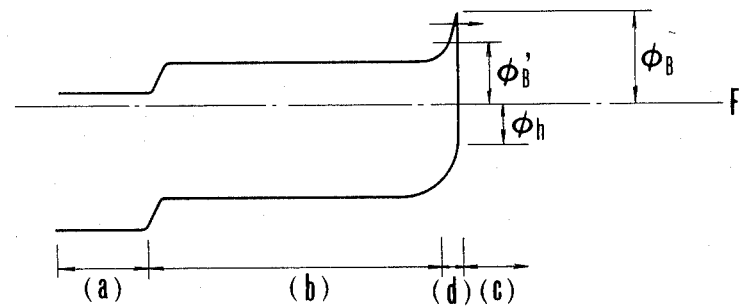
FIG. 10 is an energy level diagram in the Schottky diode of FIG. 9.

With this arrangement, a high electric field intensity zone is formed in the depletion layer in the neighborhood of a region (c) corresponding to the Schottky electrode 3 as shown in FIG. 10. Electrons can freely pass through this zone due to the tunnel effect, so that the effective potential barrier value $\phi$B' with respect to electrons becomes smaller than the actual potential barrier value $\phi$B. That is, the condition $\phi$B (i.e., $\phi$B')$<$1.0 eV can be met equivalently. In FIG. 10, a region (d) corresponds to the n-type intervening layer 5. The effective reduction of $\phi$B by this method can be satisfactorily controllable if $\phi$B is 1.1 to 1.2 eV. The actions that are involved in this method are detailed for instance, in an article entitled "Reducing the Effective Height of a Schottky Barrier Using Low-energy Ion Implanation", by J. M. Shannon, Appl. Phys. Lett., Vol. 24, No. 8, pp. 369–371, (1974).

Even where the conditions $\phi$h$<$0.4 eV and $\phi$B$<$1.0 eV are rather met, $\phi$B is desirably as high as possible in the aforementioned range from the standpoint of the reduction of the leakage current. It is possible to increase 100 B equivalently in the following way.

Figure 11:
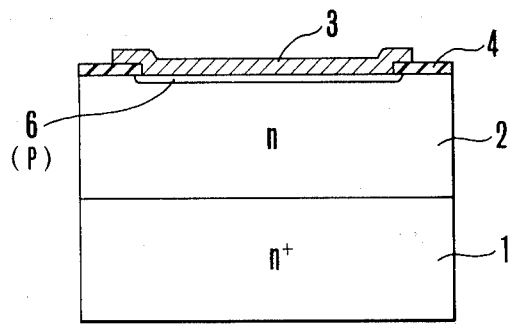
FIG. 11 is a sectional view showing a schematic construction of still another example of the Schottky diode according to the invention.

As shown in FIG. 11, a thin p-type intervening layer 6 is provided between n-type epitaxial layer 2 and Schottky electrode 3. By so doing, the effective potential barrier value $\phi$B' of the Schottky junction with respect to electrons can be made greater than the actual value $\phi$B as shown in FIG. 12. Thus, the leakage current in the element can be reduced. In FIG. 12, a region (e) corresponds to the p-type intervening layer 6. In this case, the effective value $\phi B'$ is of course to be suppressed to 1.0 eV or less. The effective increase of $\phi B$ of the Schottky barrier by this method is extensively treated in "Increasing the Effective Height of a Schottky Barrier Using low-energy Ion Implantation", by J. M. Shannon, Appl. Phys. Lett., Vol. 25, No. 1, pp. 75-77 (1974).

For reducing the reverse leakage current, it is possible to provide a thin high resistivity n-type layer or p-type layer or both at the boundary between the n-type epitaxial layer 2 and the Schottky electrode 3. Again in this case, the electric field intensity in the neighborhood of the Schottky junction can be reduced to reduce $\phi B$ by virtue of a region (f) corresponding to the intervening layer as shown in FIG. 13.

The invention is applicable to a pn junction diode as will be described with reference to FIG. 14 showing a schematic construction of this embodiment. Different from the aforementioned conventional high impurity concentration p+ contact structure having the intervening p+ contact layer between the p-type epitaxial layer 12 deposited on n-type substrate 11 and the metal electrode 15, the pn junction diode of this embodiment has a high resistivity p-type epitaxial layer 12 which makes direct contact to a metal electrode 15 to form a Schottky junction. Denoted by 14 is a metal electrode.

FIG. 15 shows an energy level diagram of this structure. As shown, the conduction band in a region (b) which corresponds to the high resistivity p-type epitaxial layer 12 is downwardly curved in the neighborhood of the contact of this region with a region (d) which corresponds to the metal electrode 15. Thus, electrons (minority carriers) coming from a region (a) which corresponds to the n-type substrate 11 flow into the metal electrode 15 without being excessively stored in the p-type epitaxial layer 12.

To realize a high speed diode with the above structure, neither the height $\phi B$ of the potential barrier of the Schottky junction in FIG. 15 with respect to electrons nor the height $\phi h$ of the potential barrier with respect to holes should be excessive. That is, in order for electrons to be passed from the n-type substrate 11 to the high resistivity p-type epitaxial layer 12 when the diode is placed in forward current conduction, the electrically neutral state must be ensured. To this end, the same quantity of holes (majority carriers) must be supplied into the p-type epitaxial layer 12 from the outside. These holes must be supplied from the metal electrode 15 by jumping over the potential barrier $\phi h$. For this reason, if the potential barrier $\phi h$ is excessive, insufficient holes are supplied so that the forward voltage is extremely increased. In this case, the element can no longer be normally used. If the potential barrier $\phi B$ is excessive, the conduction band in the p-type epitaxial layer 12 is greatly curved upwards at the Schottky junction. In this case, like the high impurity concentration p+ contact structure shown in FIG. 16, the reverse recovery speed of the diode is reduced with increased charge storage effect. For the above reasons, the potential barrier values $\phi B$ and $\phi h$ of the Schottky junction with respect to electrons and holes must be set in optimum ranges so that no barrier may be formed against the flow into the metal electrode 15 of electrons injected from the n-type substrate 11 to the p-type epitaxial layer 12 while permitting injection of holes from the metal electrode 15 into the p-type epitaxial layer 12.

Figure 16:
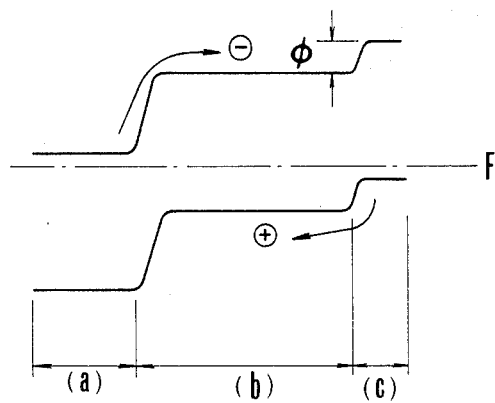
FIG. 16 is an energy level diagram in a prior art pn junction diode of high impurity concentration p+ contact structure.

Features of the energy level diagram of the pn junction diode according to the FIG. 14 embodiment will become more apparent in comparison with an energy level diagram as shown in FIG. 16 of the conventional high impurity concentration p+ contact structure.

In FIG. 16, regions (a) and (b) correspond to the n-type substrate and the p-type epitaxial layer, respectively, and a region (c) corresponds to the high impurity concentration p+ contact region, that is, the aforementioned low-high electrode region.

When the structure of FIG. 14 is used as an actual diode, a minimum quantity of electrons necessary to cause forward current in a forwardly biased state must be present in the p-type epitaxial layer 12. In this case, however, if the thickness of the p-type epitaxial layer 12 is excessive, the quantity of electrons present in the layer is increased to reduce the reverse recovery speed. The thickness of the p-type epitaxial layer 12 is thus limited in this respect.

Regarding the reverse characteristics of the diode structure according to this embodiment, it is preferable that thickness $W_2$ and resistivity $\rho$ of the p-type epitaxial layer 12 be determined such that a depletion layer that extends from the n-type substrate 11 to the p-type epitaxial layer 12 in a reversely biased state will not be in contact with the metal electrode (i.e., Schottky electrode) 15 forming the Schottky junction. In this case, the reverse leakage current is as small as in the usual pn junction diode without gold doping so that it can be ignored even at high temperatures. Thus, it is possible to permit severe working conditions to be withstood and also miniaturize heat radiating devices. The obtainable breakdown voltage is up to approximately one half the product of the thickness of the p-type epitaxial layer and the avalanche electric field value of the semiconductor. On the other hand, it is desirable to set the thickness and resistivity of the p-type epitaxial layer 12 to 5 $\mu$m or more and 1 $\Omega$cm or more, respectively, in case of silicon pn junction diode to provide for a practically sufficient breakdown voltage.

Specific ranges of $\phi B$ and $\phi h$ which have to be met by the diode structure according to this embodiment will now be explained in connection with the case of a silicon pn junction diode.

Figure 17:
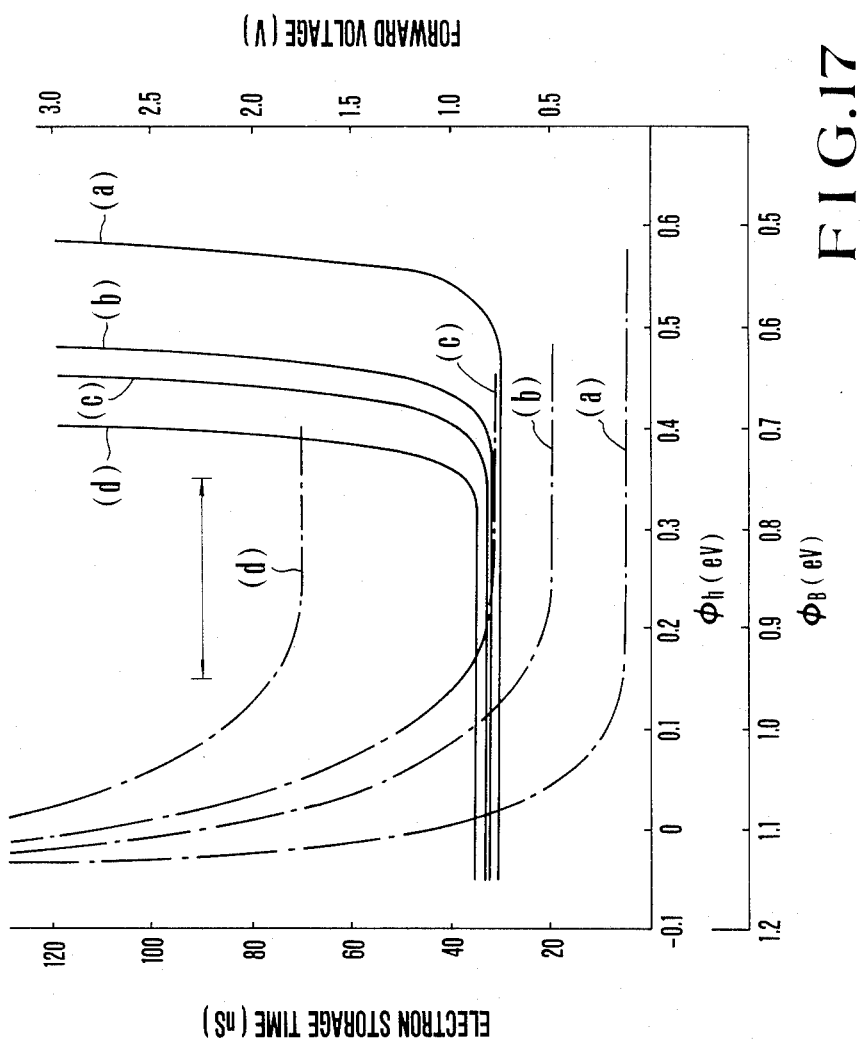
FIG. 17 is a graph showing the dependency of forward voltage and hole storage time on Schottky potential barrier values in silicon pn junction diodes.

FIG. 17 shows, like FIG. 5 for the previous embodiment, calculated values of forward voltage (solid curves) and electron storage time (chained line curves) in the ranges $\phi B=1.2$ to 0.5 eV and $\phi h=-0.1$ to 0.6 eV. Since the sum of $\phi B$ and $\phi h$ is always equal to the forbidden band width of 1.1 eV, $\phi B$ and $\phi h$ are graduated in the opposite directions in the abscissa in the graph. In the graph curves are shown for various values of the thickness of the p-type epitaxial layer 12 ranging from 5 $\mu$m to 30 $\mu$m. More particularly, curves (a), (b) and (c) are obtained in cases where the thickness of the p-type epitaxial layer 12 is respectively 5 $\mu$m, 15 $\mu$m, 20 $\mu$m and 30 $\mu$m. The thickness of 5 $\mu$m is the lower limit necessary for obtaining a breakdown voltage that can feature the structure of the pn junction diode according to this embodiment. The thickness of 30 $\mu$m is the upper limit from the standpoint of the reverse recovery speed as will be described later. Since the normal current density in a power diode is usually 50 to 300 A/cm$^2$, the forward voltage drop at 300 A/cm$^2$ is from 0.1 to 1.8 volts, and the hole storage time is shown at a maximum value within the aforementioned current density range. The values in the graph are substantially independent of the resistivity $\rho$ ($>1$ cm) of the p-type epitaxial layer 12.

It will be seen from FIG. 17 that for a range φh>0.35 eV the element cannot be used in practice because the forward voltage is sharply increased due to an insufficient amount of holes introduced and for a range φB>0.95 eV (φh<0.15 eV) the element again cannot be used in practice because the electron storage time is sharply increased due to an upward curving of the conduction band of the p-type epitaxial layer 12 in the neighborhood of the Schottky junction. For the above reasons, φB and φh must be set within the ranges of φB<0.95 eV and φh<0.35 eV as shown by arrows in the graph. Suitable examples of the material of the metal electrode to meet these conditions are, as in the previous embodiment, Pt (φh=0.2 eV), Pd (φh=0.35 eV), Pt Si (φh=0.25 eV) and Ir (φh=0.15 eV), of which Pt Si showing a medium of φh is the most preferable. Further, with metals with which φB and φh are slightly above the aforementioned ranges, it is possible to reduce the values of φB and φh equivalently by 0.1 to 0.2 eV, as explained in the foregoing with reference to the Schottky diode of the previous embodiment, so that the effective values of φB and φh may be within the aforementioned ranges according to this embodiment. In this connection, one may refer to "Control of Schottky Barrier height by Their High-doped Layer" by T. Harice et al, Proceeding of IEEE, Vol. 63, P. 1523 (1975).

It is also estimated from FIG. 17 that when the thickness $W_2$ of the p-type epitaxial layer 12 exceeds 30 μm, the hole storage time will be prolonged, thus preventing attainment of high speed operation. The prior art diode of the high impurity concentration p+ contact structure explained previously corresponds to the case where φh is approximately −0.1 eV.

A specific construction of this embodiment will be described.

Figure 18:
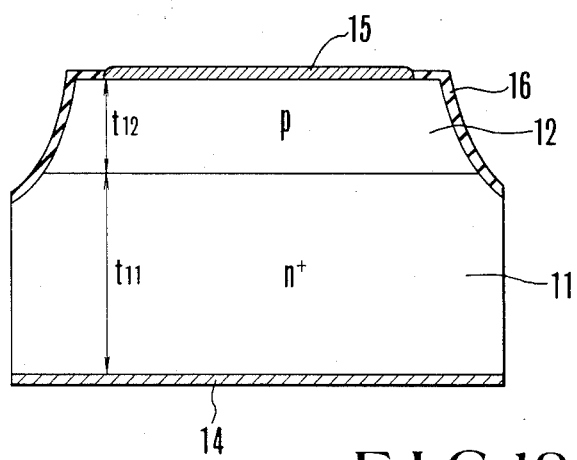
FIG. 18 is a sectional view showing an example of the pn junction diode according to the invention.

In FIG. 18, on an n-type silicon substrate having a thickness of t11=280 μm and a resistivity of 0.01 Ωcm, a p-type silicon epitaxial layer 12 with a resistivity of 10 Ωcm is deposited to a thickness of t12=18 μm (corresponding to $W_2$ in FIG. 14). With this resistivity and thickness, the depletion layer will not reach the Schottky junction even under the application of the breakdown voltage. An edge portion of the surface of the p-type epitaxial layer 12 is then etched to a depth of 30 μm to form a mesa portion. Then, an oxide film 16 is formed by oxidation for protecting the edge of the mesa portion. Then a window is formed in the oxide film portion corresponding to an electrode, and then platinum is deposited to a thickness of 0.5 μm to form a Schottky electrode 15. A metal electrode 14 is formed on the back side by doping an n-type impurity with a surface impurity concentration of $1 \times 10^{20}$ cm$^{-3}$) or more and to a depth of approximately 1 μm and then depositing nickel to a thickness of 0.2 μm and then silver to a thickness of 0.5 μm.

Finally, heat treatment is carried out at 450° C. for 20 minutes. The pn junction diode thus formed has an effective area of 20 mm² and a breakdown voltage of 220 V.

FIG. 19 shows reverse characteristics of the pn junction diode according to this embodiment in comparison with those of the conventional high speed gold doped pn junction diode. In FIG. 19, temperatures are permissible temperatures. For comparison of characteristics of the gold doped pn junction diode with those of the present diode, reference is made to Table 2 below.

TABLE 2

| | Forward voltage (V) | Leakage current (mA) at 200°C. | Permissible temp. (°C.) | Switching noise |
|---|---|---|---|---|
| Gold doped pn junction diode | 0.95 | 100 | 150 to 175 | large |
| The present diode | 0.80 | 10 | 200 or more | small |

A diode body and heat sink fingers are put together to complete a power diode assembly. The diode, according to both the former and latter embodiments, having the high upper limit of permissible temperature can effectively reduce the area of the heat sink fingers, thereby making it possible to reduce the size of the completed assembly. For example, when the surface area of heat sink fingers for the conventional Schottky diode is taken to be 1 (one), the finger surface area for the pn junction diode according to the invention can be reduced to about 45%. For the Schottky diode of the invention, the finger surface area can be reduced to about 75%.

FIG. 20 shows the reverse recovery characteristic of the diode described above. The curve shows the current plotted against time, and is obtained by first causing a forward current of 30 A and then reducing it at a rate of 50 A/μsec.

As shown, the reverse recovery time is approximately 80 nsec. With the usual pn junction diode, the reverse recovery time is from 200 nsec to 1 μsec. Thus, according to the present embodiment, the speed can be increased. It is to be noted from the Figure that reverse current has a trailing portion in the latter half of the reverse recovery to provide a soft recovery characteristic, resulting in a low switching noise and a low surge voltage drop. The forward voltage is 0.80 V when the current is 30 A.

While, in the foregoing description, the pn junction diode embodying the invention has the Schottky electrode formed on the surface of the p-type epitaxial layer, the invention is also applicable to a pn junction diode wherein an n-type epitaxial layer is deposited on a p-type substrate and a Schottky electrode is formed on the n-type epitaxial layer.

As has been described, according to the invention, the electrode is provided which establishes the Schottky barrier that permits bidirectional passage of minority and majority carriers, and thickness and resistivity of the epitaxial layer adjoining the electrode are set to fall within the specified ranges, thereby improving electric properties required for rectifying diodes for the switching power source.

What is claimed is:

1. A low loss, high speed and high breakdown voltage diode comprising:
a semiconductor substrate;
a semiconductor layer deposited on the upper surface of the semiconductor substrate and having a thickness dimension W whose value lies between upper and lower predetermined limiting critical values 5 μm<W<30 μm and having a resistivity p above a predetermined lower critical value p>1 Ωcm; first metal electrode means directly formed over the entire surface of the active region of the semiconductor layer and forming a Schottky barrier metal contact with the semiconductor layer, said Schottky barrier metal contact acting as one of the metal electrodes of said diode and forming bidirectional conducting Schottky potential barriers $\phi h$ and $\phi B$ with respect to hole and electron carriers, respectively, said Schottky potential barriers lying within critical values $0.1 \text{ eV} < \phi h < 0.4 \text{ eV}$ or $0.7 \text{ eV} < \phi B < 1.0 \text{ eV}$ which allows both hole and electron carriers to pass bidirectionally therethrough in opposite directions;

second metal electrode means formed on the lower surface of said semiconductor substrate; and wherein the said diode is a silicon p-n junction diode, the semiconductor substrate is of n-type, the semiconductor layer is formed of a p-type epitaxial layer, and the said first electrode means makes a Schottky potential barrier with the p-type epitaxial layer to form the said bidirectional conducting Schottky barrier and wherein the said p-type epitaxial layer has the thickness of W and the resistivity of p, the first electrode means is formed by a metal layer having a Schottky potential barrier with a value of $\phi h$ for holes moving from the said metal layer to the p-type epitaxial layer, and the values of p, $\phi h$, and W are in the range as defined below $P > 1 \ \Omega \text{cm}$ $0.15 \text{ eV} < \phi h < 0.35 \text{ eV}$ $5 \ \mu\text{m} < W < 30 \ \mu\text{m}.$ 2. A diode according to claim 1, wherein the said metal layer is made of a material selected from Pt, PtSi, Pd, Ir, and NiPt.

3. A diode according to claim 2 further comprising a mesa etched portion formed around the said p-type epitaxial layer and oxide layer formed thereon.

* * * * *